United States Patent [19]

Maeda

[11] Patent Number: 5,278,099
[45] Date of Patent: Jan. 11, 1994

[54] METHOD FOR MANUFACTURING A SEMICONDUCTOR DEVICE HAVING WIRING ELECTRODES

[75] Inventor: Takeo Maeda, Tokyo, Japan

[73] Assignee: Kabushiki Kaisha Toshiba, Kawasaki, Japan

[21] Appl. No.: 976,664

[22] Filed: Nov. 16, 1992

Related U.S. Application Data

[63] Continuation of Ser. No. 812,851, Dec. 20, 1991, abandoned, which is a continuation of Ser. No. 377,731, Jul. 10, 1989, abandoned, which is a continuation of Ser. No. 860,040, May 6, 1986, abandoned.

[30] Foreign Application Priority Data

May 13, 1985 [JP] Japan .................. 60-100915
Sep. 5, 1985 [JP] Japan .................. 60-196503

[51] Int. Cl.$^5$ ........................... H01L 21/44
[52] U.S. Cl. ..................... 437/192; 437/190; 437/194; 437/200; 437/203
[58] Field of Search ........... 437/190, 192, 194, 200, 437/203, 202, 189; 204/192.15, 298.26, 298.05

[56] References Cited

U.S. PATENT DOCUMENTS

| | | | |
|---|---|---|---|
| 4,420,385 | 12/1983 | Hartsough | 204/298.26 |
| 4,437,961 | 3/1984 | Routh et al. | 204/192.15 |
| 4,502,209 | 3/1985 | Eizenberg et al. | 357/71 |
| 4,556,897 | 12/1985 | Yorikane et al. | 357/71 |
| 4,570,328 | 2/1986 | Price et al. | 357/71 |
| 4,622,919 | 11/1986 | Suzuki et al. | 204/298.05 |

FOREIGN PATENT DOCUMENTS

| | | | |
|---|---|---|---|
| 2940200 | 3/1981 | European Pat. Off. | 437/200 |
| 54-71983 | 6/1979 | Japan | 357/67 |
| 0048249 | 3/1982 | Japan | 437/192 |
| 57-139939 | 8/1982 | Japan | 357/71 |
| 57-183054 | 11/1982 | Japan | 357/71 |
| 0035919 | 3/1983 | Japan | 437/92 |
| 0046631 | 3/1983 | Japan | 437/194 |
| 58-101454 | 6/1983 | Japan | 357/71 |
| 58-182873 | 10/1983 | Japan | 357/67 |
| 0231836 | 12/1984 | Japan | 437/200 |
| 60-5560 | 1/1985 | Japan | 357/67 |

OTHER PUBLICATIONS

Ting, "TIN formed by evaporation as a diffusion barrier between Al and Si", J. Vac. Sci. Technol., 21(1) May/-Jun. 1982, pp. 14-18.
Rosser et al., "Self aligned Nitridation of TiSi$_2$: A TiN/TiSi$_2$ contact structure", Mat. Res. Soc. Symp. Proc., vol. 37, 1985, pp. 607-612.
Wittmer, "High-Temperature Contact Structures for Silicon Semi-conductor Devices," Appl. Phys. Lett. 37(6), pp. 540-542, Sep. 15, 1980.
Abstract in English of Japanese Patent Publication No. 58-101454.
C. Y. Ting, "New Structure for Contact Metallurgy," IBM Technical Disclosure Bulletin, vol. 7, No. 12, May 1983, pp. 6398-6399.
H. M. Dalal and J. E. Taylor, "Multilevel Interconnection Metallurgy System for Semiconductor Devices", IBM Technical Disclosure Bulletin, vol. 15, No. 10, Mar. 1973, pp. 3027-3028.
I. Suni, M. Blomberg, and J. Saarilahti, "Performance of Titanium Nitride Diffusion Barriers in Aluminum-Titanium Metallization Schemes for Integrated Circuits," J. Vac. Sci. Technol. A, vol. 3, No. 6, Nov./Dec. 1985, pp. 2233-2236.

Primary Examiner—Brian E. Hearn
Assistant Examiner—Tuan Nguyen
Attorney, Agent, or Firm—Finnegan, Henderson, Farabow, Barrett & Dunner

[57] ABSTRACT

A semiconductor device of the invention has a p$^+$-type silicon source region, an insulating film formed on the source region and having a contact hole, and a wiring electrode connected to the source region through the contact hole. The wiring electrode has a Ti layer formed on the insulating film and an exposed surface of the source region, a TiN layer formed on the Ti layer, and an Al layer formed on the TiN layer.

12 Claims, 5 Drawing Sheets

METHOD FOR MANUFACTURING A SEMICONDUCTOR DEVICE HAVING WIRING ELECTRODES

This application is a continuation, of application Ser. No. 07/812,851 filed Dec. 20, 1991, abandoned, which is a continuation of application Ser. No. 07/377,731 filed Jul. 10, 1989, abandoned, which is a continuation of application Ser. No. 05/860,040 filed May 6,1986 abandoned.

BACKGROUND OF THE INVENTION

The present invention relates to a semiconductor device having wiring electrodes and, more particularly, to a semiconductor device wired through contact holes.

In semiconductor devices such as MOS transistors, aluminum is used as a wiring layer. A MOS transistor has, for example, n-type diffusion regions in the surface area of a p-type silicon substrate. These regions are used as a source and drain. Contact holes are formed by patterning an insulating layer covering the substrate and diffusion layers. Wiring layers are formed, extending through the contact holes and contacting the diffusion layers. In connecting the wiring layer with the diffusion layer, Al is deposited on the diffusion layer by sputtering, and alloyed with Si by annealing.

However, when the wiring layer is heated to a temperature of 450° C. in another step, the Al diffuses from the wiring layer into the silicon substrate, growing Al-Si spikes within the substrate. In recent years, shallow diffusion layers are often formed with the use of $BF_2$ and $BCl_2$, and, in this case, the alloy spikes may grow deeper than the diffusion layer. If spikes penetrate the diffusion layer and reach the substrate, the pn junction between the substrate and the diffusion layer will break down.

Furthermore, disconnection of the wiring layer occurs easily in the portion inside of the contact hole. This is because electromigration occurs in this portion when a relatively large current flows in the Al wiring layer.

Two conventional methods of preventing alloy spikes are known. In the first method. Al is deposited by sputtering, together with about 1 to 5% of Si (based on Al amount), onto the diffusion layer. This method can reliably prevent alloy spikes. However, it can only be used when an increase in contact resistance can be ignored. In practice, such an increase in contact resistance cannot be ignored, and the Si amount must be reduced to a low percentage at which alloy spikes can not be sufficiently prevented. Namely, a high amount of silicon is preferable in the control of alloy spike growth. If the Si amount exceeds the solid solubility of Al, however, solid Si precipitates in the wiring layer in addition to the Al-Si alloy. The precipitated Si has a remarkably low conductivity. The contact resistance of the wiring layer undesirably increases due to the low conductivity. In particular, the narrow region of the wiring layer inside of the contact hole may be electrically separated from the diffusion region due to the precipitated Si. In addition, Al and Si may not always be deposited at a uniform ratio during sputtering. As a result, even if the Si amount is within the solid solubility of Al, Si will precipitate in a portion of the wiring layer.

In the second conventional method, a barrier metal layer, such as a TiN layer, is formed between the diffusion layer and the Al layer. When the barrier metal is TiN, the boron (B) contained in the diffusion layer diffuses into the TiN layer, making it impossible to obtain good ohmic contact.

SUMMARY OF THE INVENTION

It is an object of the present invention to provide a semiconductor device which prevents alloy spikes without increasing the contact resistance of a wiring layer and offers good resistance against electromigration.

According to the invention, there is provided a semiconductor device comprising: a semiconductor element; an insulating film formed on the semiconductor element and having a contact hole which exposes a portion of this element; and a wiring electrode formed on the insulating film, extending through the contact hole, and contacting the semiconductor element, the electrode having a first layer of Ti formed on the insulating film and the exposed portion of the semiconductor element, a second layer of TiN formed on the first layer, and a third layer having Al as a major component and formed on the second layer.

According to the device of this invention, the first and second layers are provided between the third layer and semiconductor element. The second layer acts as a barrier metal to block Al diffusion along grain boundaries in the third layer, thus preventing occurrence of alloy spikes. The first layer maintains a low contact resistance between the wiring layer and the semiconductor element. The first and second layers, having high resistance to electromigration, will constitute a current path even if the third layer disappears due to electromigration.

DETAILED DESCRIPTION OF THE PREFERRED EMBODIMENTS

Figure 1A:
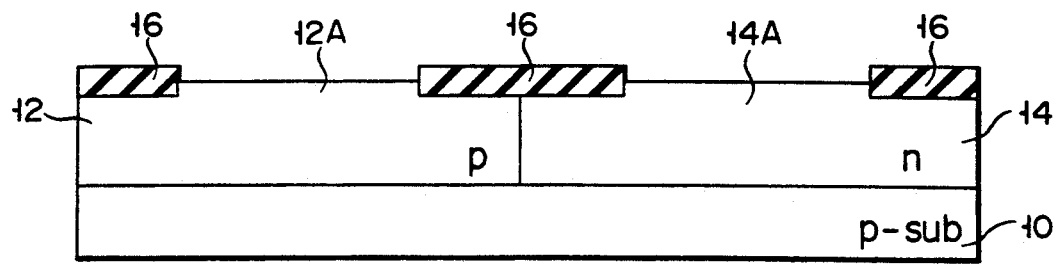
FIGS. 1A to 1F show steps in the manufacture of a CMOS transistor according to a first embodiment of the present invention.
Figure 1B:
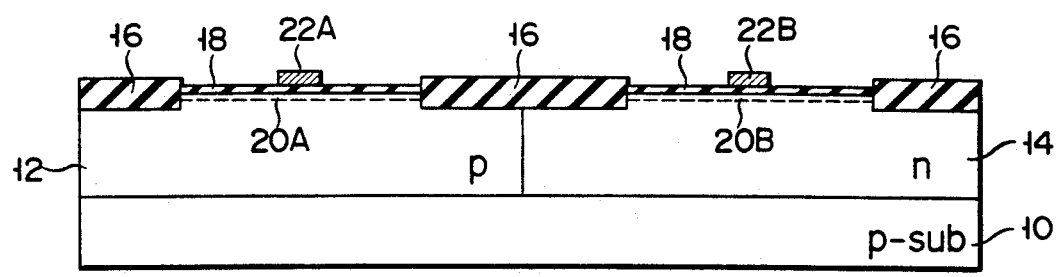
Figure 1C:
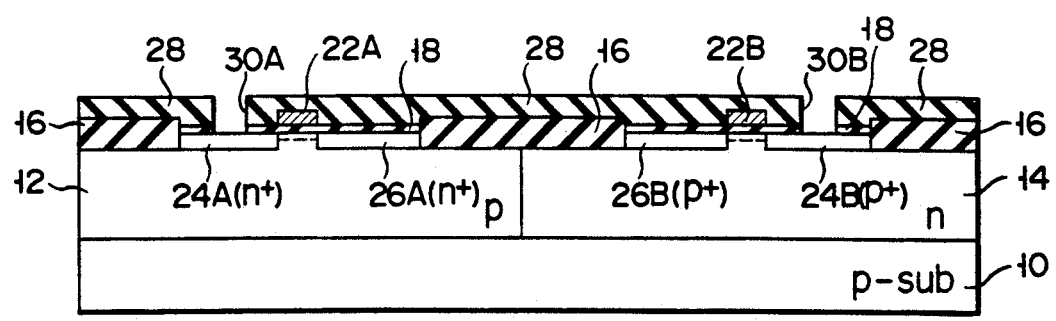

A semiconductor device according to a first embodiment of the present invention will be described with reference to FIGS. 1A to 1F. FIGS. 1A to 1F show steps in the manufacture of a CMOS transistor. In the first step, P-type silicon substrate 10 is prepared. p-type well 12 and n-type well 14 are formed in the surface area of substrate 10, as shown in FIG. 1A. Field oxide film 16 is formed to surround portions 12A and 14A of wells 12 and 14, which serve as element regions, as shown in FIG. 1A. The surfaces of element regions 12A and 14A are completely covered by gate oxide film 18, as shown in FIG. 1B. Channel implantation processing is then performed to set the threshold voltage of the transistor. This results in the formation of ion implantation layers 20A and 20B in regions 12A and 14A. A polycrystalline silicon layer (not shown) is formed on films 16 and 18 by deposition, doped with a predetermined amount of an impurity, and patterned. The remaining polycrystalline silicon constitutes gate electrodes 22A and 22B, as shown in FIG. 1B. An n-type impurity (e.g., P or As) and a p-type impurity (e.g., B, $BF_2$, or $BCl_2$) are ion-implanted in wells 12 and 14 in separate steps, using electrodes 22A and 22B as masks. Substrate 10 is then annealed, forming n+-type source and drain regions 24A and 26A in the surface area of well 12, and forming p+-type source and drain regions 24B and 26B in the surface area of well 14, as shown in FIG. 1C. Films 16 and 18 and electrodes 22A and 22B are covered by interlayer insulating film 28. Films 28 and 18 are patterned to form contact holes 30A and 30B, as shown in FIG. 1C. Contact holes 30A and 30B expose the corresponding portions of regions 24A and 24B.

Figure 1D:
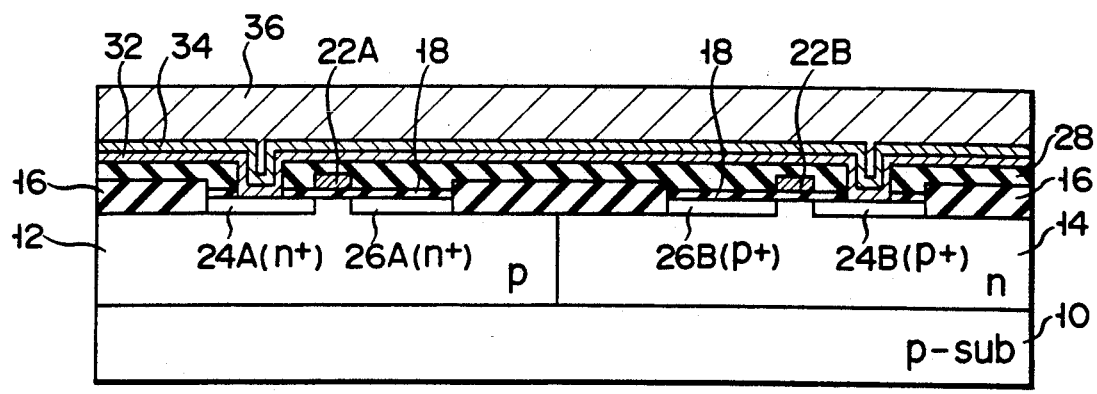
Figure 1E:
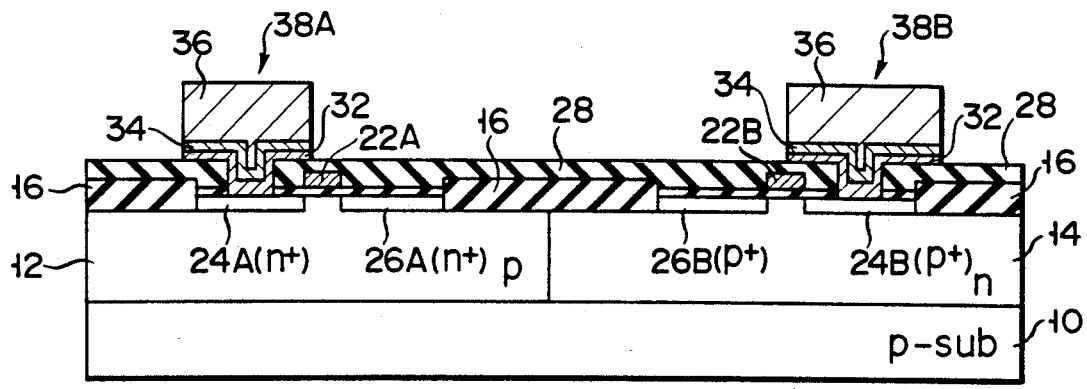
Figure 1F:
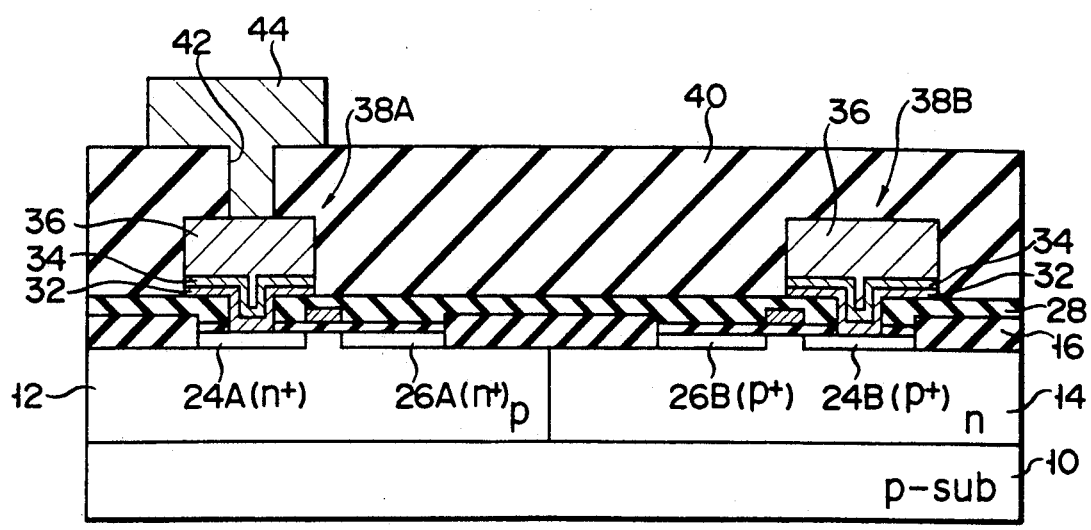

Ti layer 32 and TiN layer 34 shown in FIG. 1D are successively formed in the same vacuum chamber by sputtering. In this step, Ti is deposited to a thickness of 50 nm on film 28 and on the exposed surfaces of source regions 24A and 24B. TiN is then deposited to a thickness of 50 nm on top of the Ti. An RF bias is applied to substrate 10 during the deposition of TiN to provide good crystallinity in the portion of contact between Ti layer 32 and TiN layer 34 and good step coverage. After layer 34 is formed, pure aluminum is deposited on layer 34 in the same vacuum chamber, forming Al layer 36, as shown in FIG. 1D. The multi-layer structure of layers 36, 34, and 32 is patterned by photoetching and reactive ion etching, as shown in FIG. 1E. Remaining structures 38A and 38B are used as wiring electrodes for source regions 24A and 24B. In the patterning step, a gas mixture of $BCl_3$, $Cl_2$ and He is used as the etchant. Wiring electrodes 38A and 38B and film 28 are completely covered by $SiO_2$ layer 40. Layer 40 is formed by a low-temperature plasma CVD method, and is patterned to form contact hole 42 on layer 36, as shown in FIG. 1F. Al layer 44, also shown in FIG. 1F, is formed by the same method and connected to layer 36. This completes the preparation of a CMOS transistor. In this transistor, electrodes 38A and 38B are used as a first-stage wiring layer, and layer 44 is used as a second-stage wiring layer. In this embodiment, wiring of the drain and control gate is formed just as described above, and has hence been omitted for the sake of brevity.

In the embodiment described above, Ti and TiN layers 32 and 34 are provided between Al layer 36 and source regions 24A and 24B. TiN layer 34 acts as a barrier metal to block Al diffusion along grain boundaries in Al layer 36, thus preventing the growth of alloy spikes. As a result, the pn junctions between source region 24A and well 12 and between source region 24B and well 14 do not break down. Ti layer 32, in addition to preventing the boron in p+-type source region 24B from diffusing into layer 34, also maintains a low contact resistance between electrodes 38A and 38B and corresponding regions 24A and 24B. Ti and TiN layers 32 and 34, having high resistance to electromigration, will constitute a current path even if Al layer 36 disappears due to electromigration. As a result, a complete failure in transistor functions cannot occur. Since TiN layer 34 has a thickness sufficient to prevent the growth of alloy spikes, Al layer 36 need not contain Si. Thus, silicon does not precipitate in electrodes 38A and 38B, and the problem caused by Si precipitation in the portions of electrodes 38A and 38B inside of the contact holes can be avoided.

An experiment verified that good contact characteristics are obtained between electrode 38A and source region 24A and between electrode 38B and source region 24B. In this experiment, Ti layer 32 was sintered at 450° C. for 15 minutes, and contact resistance was measured. The Ti was satisfactorily changed into TiSi by the sintering process, demonstrating that good contact characteristics can be obtained.

Figure 2:
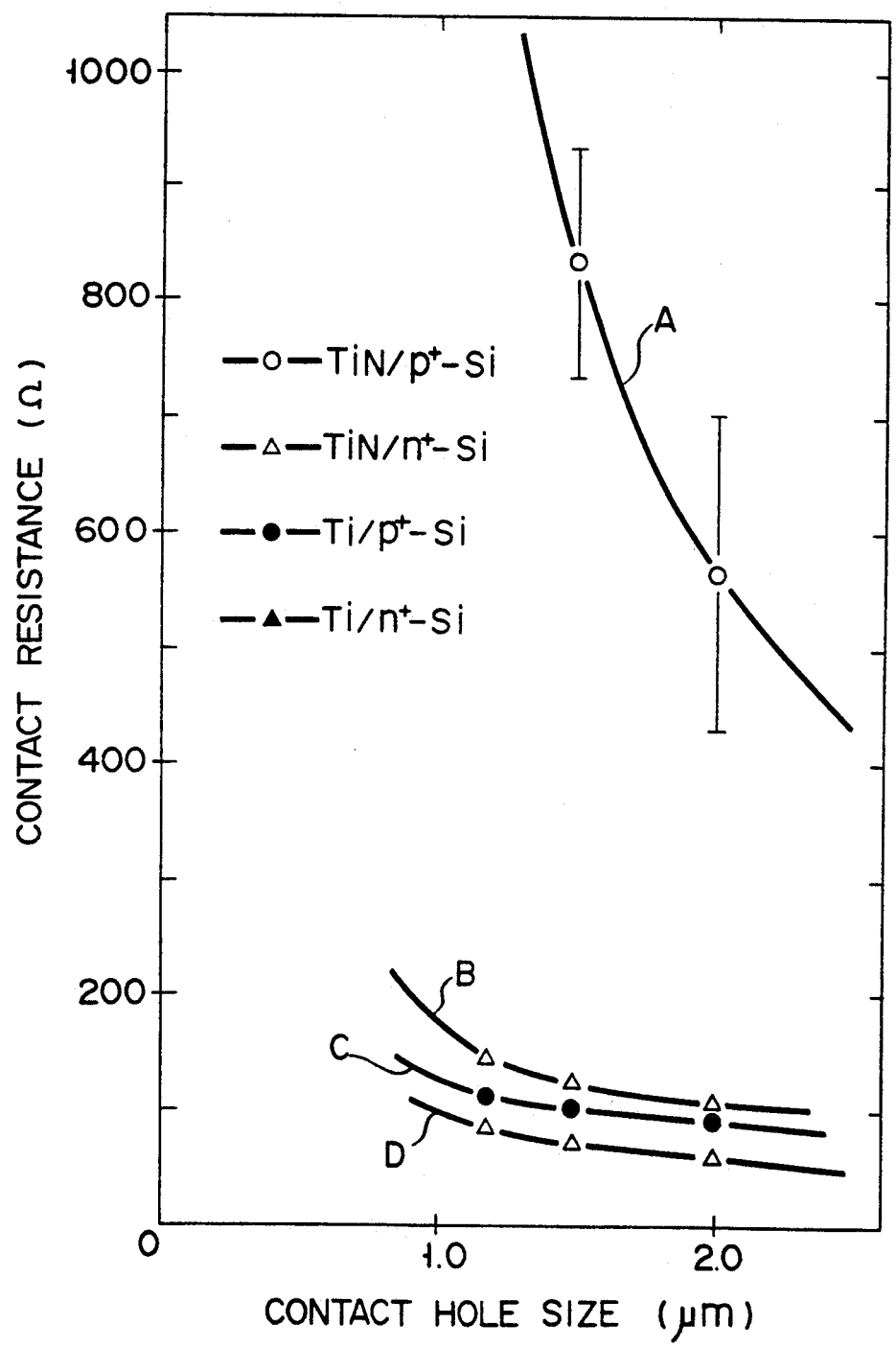
FIG. 2 is a graph for explaining the relationship between contact resistance and contact hole size.

FIG. 2 shows the relationship between contact resistance and contact hole size. Curves (A) and (B) in FIG. 2 show the case where TiN is connected by a conventional technique to p+-type and n+-type silicon, respectively. Curves (C) and (D) show the case where Ti is connected to p+-type and n+-type silicon, respectively, according to the embodiment described above. As can be seen from the graph, there is no drastic increase in contact resistance with the devices according to the embodiment, even when contact hole size is reduced. Ti and p+-type silicon (i.e., Ti layer 32 and source region 24B) particularly experience larger reductions in contact resistance than in the conventional method.

In the above embodiment, pure aluminum layer 36 is used. The present invention, however, is not limited to this. The layer 36 can be replaced by one alloy selected from Al-Si, Al-Ti-Si, Al-Zr-Si, Al-Ti, and Al-Zr. When an alloy layer containing Ti or Zr is used, Al electromigration and Al hillocks are prevented. When an alloy layer containing Si is used, the resistances of the alloy layer and the boron-doped diffusion layer are sufficiently kept low. In addition, openings in the wiring are prevented.

It is also possible to change the manufacturing steps for the CMOS transistor described above in the following manner. After forming layers 32 and 34 with sputtering in the same vacuum chamber, as shown in FIG. 1D, the semiconductor structure is annealed at 600° C. for 30 minutes in a nitrogen atmosphere. This insures the complete transformation to TiN of the Ti grains in layer 34.

Figure 3A:
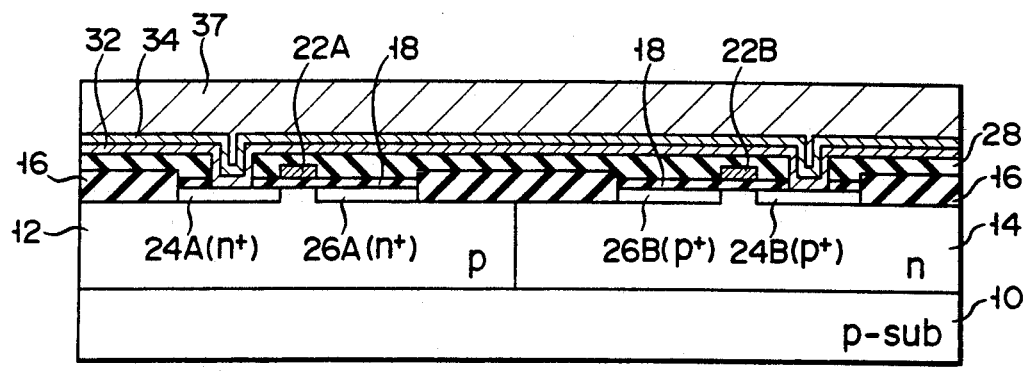
FIGS. 3A and 3B are diagrams for explaining steps in the manufacture of a CMOS transistor according to a second embodiment of the present invention.

After annealing, Al-Si alloy layer 37 is formed on layer 34, as shown in FIG. 3A. Argon (Ar), for example, is then ion-implanted in the surface area of layer 37 at a dose of $5 \times 10^{15}$ cm$^{-2}$ and an acceleration voltage of 30 keV. This causes the portion of layer 37 as extending to the dashed line (FIG. 3) to become amorphous. The remaining steps are the same as the steps above described.

When TiN layer 34 is annealed in a nitrogen atmosphere as described above, the Ti in layer 34 becomes a nitride. This serves to control so that an Al-Si-Ti three-element alloy is not formed. Al-Si alloy layer 37 prevents alloy spikes, event if layer 34 has pinholes. Furthermore, since the surface crystal of layer 37 is broken through the Ar ion-implantation, the Al in layer 37 does not migrate along grain boundaries during the formation of layer 44. Thus, the generation of hillocks, electromigration, and thermal migration are prevented. With the device, the wiring is hardly be disconnected along Al grain boundaries. The amorphous portion of layer 37 absorbs stress when the layer 44 is formed.

In addition, layer 37 may be replaced with Al layer 36.

Figure 3B:
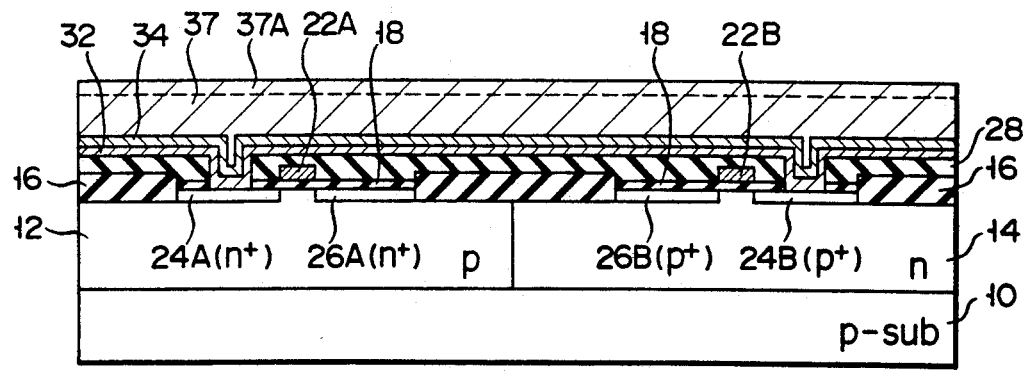
Figure 4:
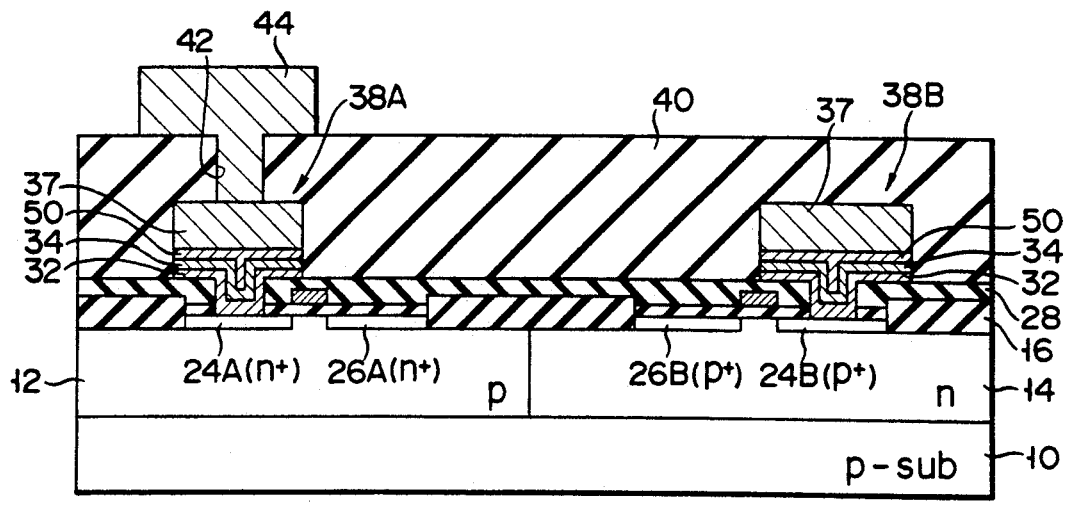
FIG. 4 shows a CMOS transistor having a Ti layer 50 according to a third embodiment of the present invention.

In FIGS. 3A and 3B above, wiring electrodes 38A and 38B have a 3-layer structure of Al alloy layer 37 (or Al layer 36), TiN layer 34, and Ti layer 32. The electrodes may also have a Ti layer 50 between layers 37 and 34. With this structure, the Ti layer 50 prevents the diffusion of N from TiN layer 34 into Al alloy layer 37

(or Al layer 36). Ti diffuses from the Ti layer into layer 37 (or layer 36), thus preventing Al hillocks.

In the above embodiments, Ar was ion-implanted in layer 37. It is also possible, however, to ion-implant As, $BF_2$, or a mixture of the two.

Figure 5:
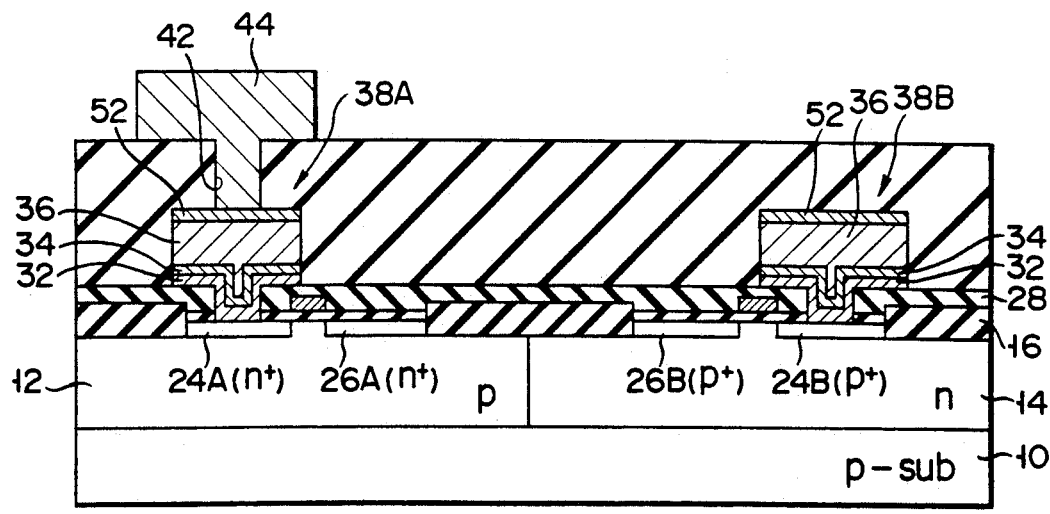
FIG. 5 shows a CMOS transistor having a TiSi layer 52 according to a fourth embodiment of the present invention.

In the first embodiment described above, wiring electrodes 38A and 38B have a 3-layer structure formed of Al, TiN and Ti layers 36, 34, and 32. However, the electrodes 38A, 38B may have a 4-layer structure in which a TiSi layer 52 is further formed on top of Al layer 36 as shown in FIG. 5. The TiSi layer 52 blocks Al hillocks with the stress corresponding to their growth and allows diffusion of Ti into the Al or Al alloy layer, thereby preventing hillocks. This Ti also plays a large role in the control of electromigration. In the manufacture of the 4-layer structure, the Ti, TiN, Al, and TiSi layers can all be deposited in the same vacuum.

What is claimed is:

1. A method for manufacturing a semiconductor device, said method comprising the steps of:

forming an insulating film covering a surface of a silicon substrate;

forming a semiconductor element in the surface of said silicon substrate;

patterning said insulating film to form a contact hole exposing a portion of said semiconductor element;

successively sputtering Ti and TiN in a single vacuum chamber to deposit a first layer of Ti on said insulating film and the exposed portion of said semiconductor element, and a second layer of TiN on said first layer;

annealing said second layer in a nitrogen atmosphere; and depositing a third layer having Al as its major component on said annealed second layer, said first, second, and third layers comprising an electrode for said semiconductor element.

2. The method of claim 1, further comprising the step of:

patterning said first, second, and third layers so that the remaining portions of said first, second, and third layers serve as a wiring layer.

3. The method of claim 2, further comprising the step of:

forming an insulative, protective film covering said wiring layer and the exposed portion of said insulating layer by low-temperature plasma chemical vapor deposition.

4. The method of claim 3, wherein said insulating layer and said insulative, protective film are comprised of silicon oxide.

5. The method of claim 1, wherein said semiconductor element is formed by doping an impurity in the surface of said silicon substrate.

6. The method of claim 5, wherein said semiconductor element contains a p-type impurity.

7. The method of claim 1, wherein said third layer is formed of a material selected from the group consisting of pure Al, Al-Si alloys, Al-Ti-Si alloys, Al-Zr-Si alloys, Al-Ti alloys, and Al-Zr alloys.

8. The method of claim 7, further comprising the step of:

forming a fourth layer consisting essentially of Ti between said second layer and said third layer.

9. The method of claim 1, further comprising the step of:

forming a fourth layer consisting essentially of TiSi on said third layer.

10. The method of claim 1, further comprising the step of:

subjecting a surface of said third layer to ion implantation of at least one impurity selected from the group consisting As, $BF_2$, and Ar so that the surface of said third layer becomes amorphous.

11. The method of claim 1, wherein said TiN is formed by a reactive sputtering method.

12. The method of claim 1, wherein said annealing step of said second layer is effected at a temperature not lower than 600° C.

* * * * *